United States Patent
Zhang et al.

(10) Patent No.: US 12,051,742 B1
(45) Date of Patent: Jul. 30, 2024

(54) ENHANCEMENT-MODE N-CHANNEL AND P-CHANNEL GAN DEVICE INTEGRATION STRUCTURE

(71) Applicant: SOUTHEAST UNIVERSITY, Nanjing (CN)

(72) Inventors: Long Zhang, Nanjing (CN); Weifeng Sun, Nanjing (CN); Siyang Liu, Nanjing (CN); Jie Ma, Nanjing (CN); Peigang Liu, Nanjing (CN); Longxing Shi, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 0 days.

(21) Appl. No.: 18/577,714

(22) PCT Filed: Dec. 29, 2022

(86) PCT No.: PCT/CN2022/143216
§ 371 (c)(1),
(2) Date: Jan. 9, 2024

(87) PCT Pub. No.: WO2023/236523
PCT Pub. Date: Dec. 14, 2023

(30) Foreign Application Priority Data

Jun. 8, 2022 (CN) .......................... 202210643717.2

(51) Int. Cl.
*H01L 29/778* (2006.01)
*H01L 29/10* (2006.01)
(Continued)

(52) U.S. Cl.
CPC ...... *H01L 29/7787* (2013.01); *H01L 29/1066* (2013.01); *H01L 29/2003* (2013.01);
(Continued)

(58) Field of Classification Search
CPC ....... H01L 2924/13064; H01L 29/7787; H01L 29/1066; H01L 29/2003; H01L 29/207;
(Continued)

(56) References Cited

U.S. PATENT DOCUMENTS

| 9,685,545 B2 * | 6/2017 | Tipirneni ............ H01L 29/0619 |
| 2015/0034972 A1 * | 2/2015 | Kuraguchi .......... H01L 29/7786 257/77 |

(Continued)

FOREIGN PATENT DOCUMENTS

| CN | 104269433 A | 1/2015 |
| CN | 209266412 U | 8/2019 |

(Continued)

*Primary Examiner* — Alonzo Chambliss
(74) *Attorney, Agent, or Firm* — Bayramoglu Law Offices LLC

(57) ABSTRACT

An enhancement-mode N-channel and P-channel GaN device integration structure comprises a substrate, wherein an Al—N nucleating layer, an AlGaN buffer layer, a GaN channel layer and an AlGaN barrier layer are sequentially arranged on the substrate, and the AlGaN barrier layer and the GaN channel layer are divided by an isolation layer; a P-channel device is arranged on one side of the isolation layer and comprises a first P-GaN layer, a first GaN isolation layer and a first P+-GaN layer are sequentially arranged on the first P-GaN layer, a first source, a first gate and a first drain are arranged on the first P+-GaN layer, the first gate is inlaid in the first P+-GaN layer, and a gate dielectric layer is arranged between the first gate and the first P+-GaN layer; and an N-channel device is arranged on the other side of the isolation layer.

7 Claims, 3 Drawing Sheets

(51) Int. Cl.
 *H01L 29/20* (2006.01)
 *H01L 29/207* (2006.01)
 *H01L 29/66* (2006.01)

(52) U.S. Cl.
 CPC ...... *H01L 29/207* (2013.01); *H01L 29/66431* (2013.01); *H01L 29/66462* (2013.01); *H01L 29/7783* (2013.01)

(58) Field of Classification Search
 CPC ......... H01L 29/66462; H01L 29/66431; H01L 29/7783
 See application file for complete search history.

(56) References Cited

U.S. PATENT DOCUMENTS

2019/0334023 A1   10/2019  Nakata
2022/0130988 A1   4/2022   Fareed et al.

FOREIGN PATENT DOCUMENTS

| CN | 110828565 A | 2/2020 | |
|---|---|---|---|
| CN | 114843267 A | 8/2022 | |
| GB | 2564482 A * | 1/2019 | ......... H01L 21/7605 |

* cited by examiner

ENHANCEMENT-MODE N-CHANNEL AND P-CHANNEL GAN DEVICE INTEGRATION STRUCTURE

CROSS REFERENCE TO RELATED APPLICATIONS

This application is a national stage entry of International Application No. PCT/CN2022/143216, filed on Dec. 29, 2022, which is based upon and claims foreign priority to Chinese Patent Application No. 202210643717.2, filed on Jun. 8, 2022, the entire contents of which are incorporated herein by reference.

TECHNICAL FIELD

The invention mainly relates to the technical field of GaN power semiconductor integration, in particular to an enhancement-mode N-channel and P-channel GaN device integration structure.

BACKGROUND OF THE INVENTION

Wide-bandgap semiconductor electronic devices are used in tasks requiring high operating voltage/speed, low power loss and a tolerance to severe operating conditions. In such devices, a wide bandgap restrains spontaneous electron transition from the valence band to the conduction band, which may be activated by environmental energy of high-field, high-temperature and high-energy particles, which makes it possible for the devices to maintain their electrical characteristics in various extreme conditions. GaN is a key wide-bandgap semiconductor, the most popular structure of which is the high electron mobility transistor (HEMT) based on planar heterojunctions. GaN HEMTs can provide high electron mobility and a small terminal capacitance in a two-dimensional electron gas (2DEG) channel, thus being particularly suitable for high-frequency/high-power density application scenarios, such as RF power amplifiers and compact power converters/power supplies.

GaN HEMTs fabricated on large silicon substrates using silicon-compatible process equipment have been developed and applied to power electronics, leading to the enhancement-mode operation with a high-voltage blocking capacity and the development of power switch devices with good stability and reliability during long-term operation. Discrete GaN HEMTs, As power switch devices, have been used for regulating current of tens of amperes and can block a high voltage as high as about 1 Kv. These key devices use a peripheral circuit as a drive, control, detection and protection module. Monolithic integration can create more on-chip functions, enhance robustness and promote the miniaturization of an entire power conversion system. GaN HEMTs adopt a planar configuration, which allows all three device terminals (the source, the gate and the drain) to be located at the top surface. Such a configuration facilitates high-density integration, which gives rise to a commercial development of GaN power switches integrated with a gate driver. However, all these GaN integrated circuits are N-channel devices using electrons as the majority carrier.

The peripheral circuit of GaN power devices is typically formed by a considerable number of logic modules. For silicon-based logic circuits, the complementary metal-oxide semiconductor (CMOS) topology is dominant because it provides the most energy-efficient solution for ultra-large-scale integrated circuits and hybrid signal integrated circuits. Although GaN-based devices have witnessed a rapid development and have been commercialized, the actual development of GaN CMOS circuits is still full of challenges, which is especially because of the lack of a suitable integration strategy for combining enhancement-mode N-channel devices and P-channel devices A commercial P-GaN gate power HEMT platform (based on P-GaN/AlGaN/GaN heterojunctions growing on a silicon substrate) is promising for realizing monolithic integration complementary logic circuit for logic control of power devices because the enhancement-mode N-channel devices are easy to obtain and the P-GaN layer provides a remarkable place for the P-channel devices. The performance of the enhancement-mode N-channel devices is improved through the gate groove technique or other processing techniques. Although the severe mismatching in mobility of electrons and holes in GaN (almost two orders of magnitude) makes GaN fail to be considered as the optimal candidate of high-speed advanced CMOSs, the low operating speed (within 100 kHz-10 MHz) required by logic control of the GaN power switches makes it possible for GaN on-chip complementary integrated circuits to provide a power electronic solution for all-GaN on-chip systems.

SUMMARY

The invention provides an enhancement-mode N-channel and P-channel GaN device integration structure, which can guarantee the enhancement mode of N-channel devices and greatly increase the output current and threshold voltage of P-channel GaN HEMTs on the basis of using a traditional N-channel GaN HEMT process.

The invention adopts the following technical solution:

An enhancement-mode N-channel and P-channel GaN device integration structure comprises a substrate, wherein an Al—N nucleating layer is arranged on the substrate, an AlGaN buffer layer is arranged on the Al—N nucleating layer, a GaN channel layer is arranged on the AlGaN buffer layer, an AlGaN barrier layer is arranged on the GaN channel layer, an isolation layer is arranged in the AlGaN barrier layer and extends into the GaN channel layer, and the isolation layer divides the AlGaN barrier layer and the GaN channel layer into two parts; a P-channel device is arranged on one side of the isolation layer and comprises a first P-GaN layer arranged on the AlGaN barrier layer on one side of the isolation layer, a first GaN isolation layer is arranged on the first P-GaN layer, a first P+-GaN layer is arranged on the first GaN isolation layer, a first source, a first gate and a first drain are arranged on the first P+-GaN layer, the first gate is inlaid in the first P+-GaN layer, and a gate dielectric layer is arranged between the first gate and the first P+-GaN layer; and an N-type channel device is arranged on the other side of the isolation layer and comprises a second source, a second P-GaN layer and a second drain which are arranged on the AlGaN barrier layer on the other side of the isolation layer, the second source and the second drain are located on two sides of the second P-GaN layer respectively, a second GaN isolation layer is arranged above the second P-GaN layer, a second P+-GaN layer is arranged above the second GaN isolation layer, and a second gate is arranged above the second P+-GaN layer.

Compared with the prior art, the invention has the following beneficial effects:

As can be seen from the above technical solution, in the invention, P-GaN is divided into three layers with different doping concentrations, the doping concentrations of the two P-GaN layers in contact with the AlGaN barrier layer and an ohmic metal layer are kept high, and the doping concentration of the P-GaN layer between the two P-GaN layers with high doping concentrations is kept low; and an Al—N insertion layer and the gate dielectric layer in a gate region of the P-channel device form a gate stack. The invention fulfills at least the following beneficial effects:

1. The bottom P-GaN layer, on one hand, provides a turn-on channel in the P-channel device and provides holes of a certain concentration under P-type doping to increase the output current of the device after then device after the device is turned on, and on the other hand, provides holes to cut off two-dimensional electron gas below the AlGaN barrier layer in the N-channel device to guarantee the enhancement mode of the N-channel device.
2. The middle GaN isolation layer has a low doping concentration, and the hole concentration of GaN below the gate region of the P-channel device is low, such that the P-channel device can be turned on or off more easily; under a fixed threshold, the thickness of GaN below the gate region can be increased to reduce the on-resistance of the device so as to increase the output current; and the middle GaN isolation layer has no obvious influence on the threshold of the N-channel device.
3. The top P+-GaN layer has a high doping concentration, which is beneficial to the formation of ohmic contact of source and drain regions of the P-channel device to decrease the contact resistance; and after the P-channel device is turned on, the top P+-GaN layer can provide a high hole concentration to increase the output current of the P-channel device.
4. A gate stack in the gate region can generate high-concentration two-dimensional electron gas by the polarization effect of the Al—N insertion layer and GaN below to cut off hole gas in the gate region, a gate dielectric layer between gate metal and the Al—N insertion layer adopts a high-forbidden bandwidth dielectric to further cut off the hole gas in the gate region; and the gate stack can increase the threshold voltage of the P-channel device.
5. CMOS integration of N-channel and P-channel GaN devices can be realized.

Figure 1:
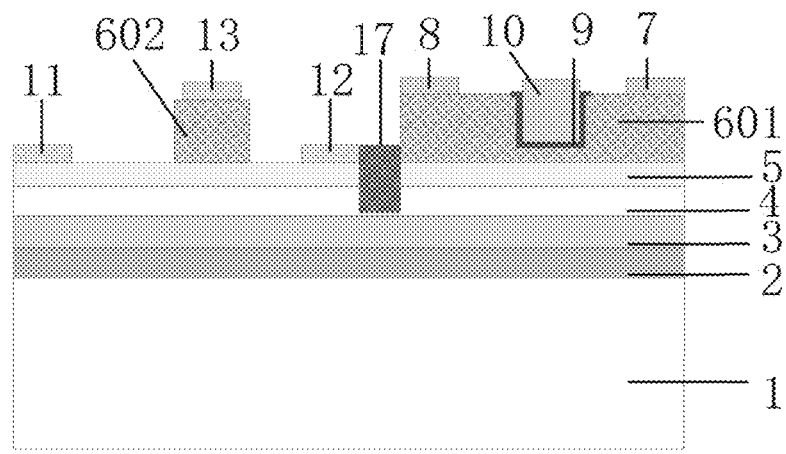
FIG. 1 is a schematic diagram of a traditional N-channel and P-channel GaN power device integration structure.

In the FIGS.: 1, substrate; 2, Al—N nucleating layer; 3, AlGaN buffer layer; 4, GaN channel layer; 5, AlGaN barrier layer; 601, first P-GaN layer; 602, second P-GaN layer; 7, first source; 8, first drain; 9, gate dielectric layer; 10, first gate; 11, second source; 12, second drain; 13, second gate; 1401, first GaN isolation layer; 1402, second GaN isolation layer; 1501, first P+-GaN layer; 1502, second P+-GaN layer; 16, Al—N insertion layer; 17, isolation layer.

DETAILED DESCRIPTION OF THE EMBODIMENTS

An enhancement-mode N-channel and P-channel GaN device integration structure comprises a substrate 1, wherein an Al—N nucleating layer 2 is arranged on the substrate 1, an AlGaN buffer layer 3 is arranged on the Al—N nucleating layer 2, a GaN channel layer 4 is arranged on the AlGaN buffer layer 3, an AlGaN barrier layer 5 is arranged on the GaN channel layer 4, an isolation layer 17 is arranged in the AlGaN barrier layer 5 and extends into the GaN channel layer 4, and the isolation layer 17 divides the AlGaN barrier layer 5 and the GaN channel layer 4 into two parts; a P-channel device is arranged on one side of the isolation layer 17 and comprises a first P-GaN layer 601 arranged on the AlGaN barrier layer 5 on one side of the isolation layer 17, a first GaN isolation layer 1401 is arranged on the first P-GaN layer 601, a first P+-GaN layer 1501 is arranged on the first GaN isolation layer 1401, a first source 7, first gate 10 and a first drain 8 are arranged on the first P+-GaN layer 1501, the first gate 10 is inlaid in the first P+-GaN layer 1501, and a gate dielectric layer 9 is arranged between the first gate 10 and the first P+-GaN layer 1501; an N-type channel device is arranged on the other side of the isolation layer 17 and comprises a second source 11, a second P-GaN layer 602 and a second drain 12 which are arranged on the AlGaN barrier layer 5 on the other side of the isolation layer 17, the second source 11 and the second drain 12 are located on two sides of the second P-GaN layer 602 respectively, a second GaN isolation layer 1402 is arranged above the second P-GaN layer 602, a second P+-GaN layer 1502 is arranged above the second GaN isolation layer 1402, and a second gate 13 is arranged above the second P+-GaN layer 1502; wherein, the substrate 1 is made from P-type silicon, sapphire, SiC or other materials, two-dimensional electron gas for turning on the N-channel device is located in the GaN channel layer 4, two-dimensional hole gas for turning on the P-channel device is located in the first P-GaN layer 601, the AlGaN barrier layer 5 has a thickness of 12-25 nm and contains 15%-30% of aluminum; and two-dimensional hole gas exists on a contact surface between the first P-GaN layer 601 and the AlGaN barrier layer 5 and is located in the first P-GaN layer 601. The groove shape, the gate dielectric layer 9 and an Al—N insertion layer 16 of a gate region of the P-channel device can cut off the two-dimensional hole gas in the gate region to realize an enhancement mode of the P-channel device; and two-dimensional electron gas exists on a contact surface of the AlGaN barrier layer 5 and the GaN channel layer 4 and is located in the GaN channel layer 4. The second P-GaN layer 602, the second GaN isolation layer 1402 and the second P$^+$-GaN layer 1502 can cut off the two-dimensional electron gas in the gate region to realize an enhancement mode of the N-channel device.

In this embodiment, the first gate 10 and the gate dielectric layer 9 extend towards the first GaN isolation layer 1401 and enters the first GaN isolation layer 1401, the Al—N insertion layer 16 is arranged on a lower surface of the gate dielectric layer 9 and located below the first gate 10, and the gate dielectric layer 9 further extends and wraps around a side face of the Al—N insertion layer 16.

The first P-GaN layer 601 and the second P-GaN layer 602 have a thickness of 10-15 nm and a doping concentration of $1.0 \times 10^{18}/cm^3$-$1.0 \times 10^{19}/cm^3$; the first GaN isolation layer 1401 and the second GaN isolation layer 1402 have a thickness of 30-40 nm and a doping concentration of $1.0 \times 10^{14}/cm^3$-$1.0 \times 10^{16}/cm^3$; the first P$^+$-GaN layer 1501 and the second P$^+$-GaN layer 1502 have a thickness of 20-35 nm and a doping concentration of $1.0 \times 10^{19}/cm^3$-$1.0 \times 10^{20}/cm^3$, and a dopant is Mg or Be; the sum of the thickness of the first GaN isolation layer 1401 and the thickness of the first P-GaN layer 601 is 20-50 nm; the Al—N insertion layer 16 has a thickness of 5-15 nm; and the gate dielectric layer 9 has a thickness of 5-10 nm and is made from aluminum oxide, silicon oxide or silicon nitride.

The invention will be further described below in conjunction with the accompanying drawings.

Operating Principle of the Invention:

At present, one of the main application scenarios of GaN is to generate high-concentration two-dimensional electron gas (2DEG) on a heterojunction interface by means of an AlGaN/GaN beterojunction structure, and GaN circuits with good performance can be designed based on the two-dimensional electron gas with good high-frequency characteristics. However, there is no good P-channel device that can be integrated with an N-channel device in design of GaN CMOS logic circuits. In existing design schemes proposed by research institutions at home and abroad, the P-channel GaN HEMT is realized, for example, on an epitaxial structure of an N-channel GaN HEMT through a P-GaN layer, or by two-dimensional hole gas generated by the polarization effect between GaN and AlGaN heterojunctions. However, P-channel devices obtained by these methods have a small current capacity, leading to an excessively large area and poor performance of a designed CMOS logic circuit. The key to realizing the GaN CMOS circuit is to design a P-channel device with a larger output current.

Figure 2:
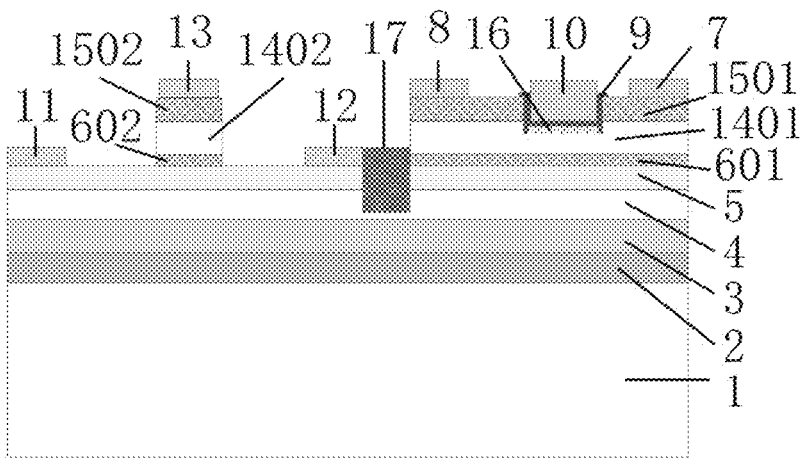
FIG. 2 is a schematic diagram of an embodiment of an enhancement-mode N-channel and P-channel GaN device integration structure according to the invention.

The invention provides a novel structure based on the traditional structure. FIG. 1 is a schematic diagram of a traditional structure for realizing the GaN CMOS circuit, and FIG. 2 is a schematic diagram of an enhancement-mode N-channel and P-channel GaN device integration structure in an embodiment of the invention. In the invention, a traditional P-GaN layer with the same doping concentration is divided into three layers with different doping concentrations, the sum of the thicknesses of the three P-GaN layers with different doping concentrations is consistent with the thickness of the traditional P-GaN layer, and the thicknesses of the three P-GaN layers are set to different values as required. The doping concentrations of the two P-GaN layers in contact with the AlGaN barrier layer and an ohmic metal layer are kept high, and the doping concentration of the P-GaN layer between the two P-GaN layers with high doping concentrations is kept low, wherein the P-GaN layer in contact with the ohmic metal layer has the highest doping concentration. By adopting the three P-GaN layers, a P-channel GaN device can be realized based on the traditional N-channel P-GaN process, the enhancement mode of the N-type channel device and the P-channel device is guaranteed, and a large output current is maintained, thus realizing a GaN CMOS structure; and a gate stack formed by the Al—N insertion layer and the gate dielectric layer in the gate region of the P-channel device can further increase the threshold voltage of the P-channel device.

Figure 7:
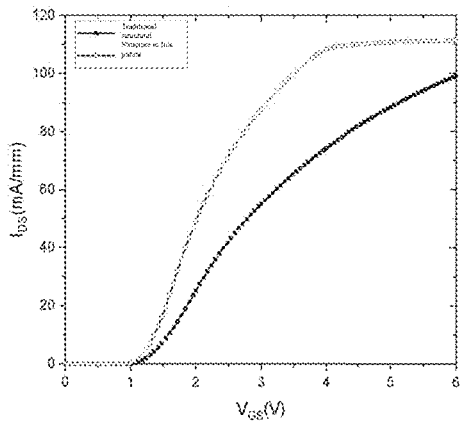
FIG. 7 is a comparison diagram of a transfer characteristic curve of an N-channel device based on the structure in an embodiment of the invention and a transfer characteristic curve of an N-channel device based the traditional structure.
Figure 8:
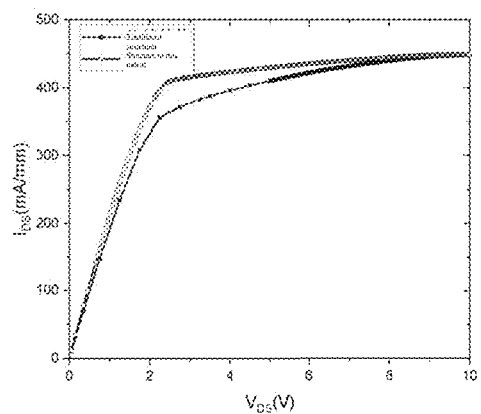
FIG. 8 is a comparison diagram of an output characteristic curve of the N-channel device based on the structure in an embodiment of the invention and an output characteristic curve of the N-channel device based the traditional structure.

First, the bottom P-GaN layer has a thickness of 8-15 nm and provides a turn-on channel when the P-channel device is in an on-state, to turn on intrinsic ionized holes and polarized two-dimensional hole gas; because P-type doping can hinder the mobility of two-dimensional hole gas to some extent, the doping concentration of the P-GaN layer can be kept to be slightly lower than the concentration of traditional. The second P-GaN layer in the gate region of the N-channel device has a P-type doping effect the same as that of the P-GaN layer of the traditional N-channel enhancement-mode HEMT, and can increase the conduction band of a whole heterojunction to deplete 2DEG in a conducting channel (GaN channel) of the heterojunction, thus guaranteeing the enhancement mode of the N-channel device. FIG. 7 is a comparation diagram of a transfer characteristic curve of the N-channel device based on the structure of the invention and a transfer characteristic curve of the N-channel device based on the traditional structure, and it can be seen from FIG. 7 that the threshold of the N-channel device based on the structure of the invention is not obviously decreased as compared with the N-channel device based on the traditional structure FIG. 8 is a comparison diagram of an output characteristic curve of the N-channel device based on the structure of the invention and an output characteristic curve of the N-channel device based on the traditional structure, and as can be seen from FIG. 8, the slope of the characteristic curve of the N-channel device based on the structure of the invention is greater than that of the characteristic curve of the N-channel device based on the traditional structure, indicating that the on-resistance of the N-channel device based on the structure of the invention is slightly decreased as compared with the N-channel device based on the traditional structure and the switching speed is high. The saturation current of the N-channel device based on the structure of the invention is basically the same as that of the N-channel device based on the traditional structure.

Figure 3:
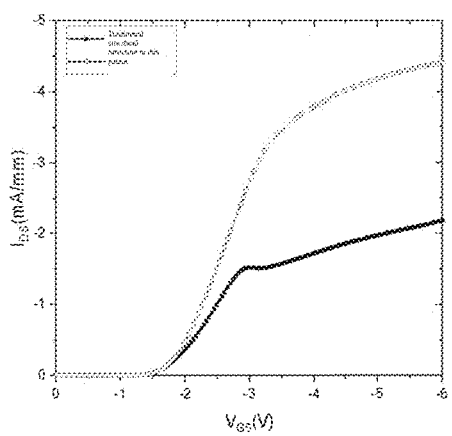
FIG. 3 is a data comparison diagram of a P-channel device based on the structure in an embodiment of the invention and a P-channel device based on the traditional structure under the condition of different P-GaN thicknesses of a gate region and the same threshold.
Figure 4:
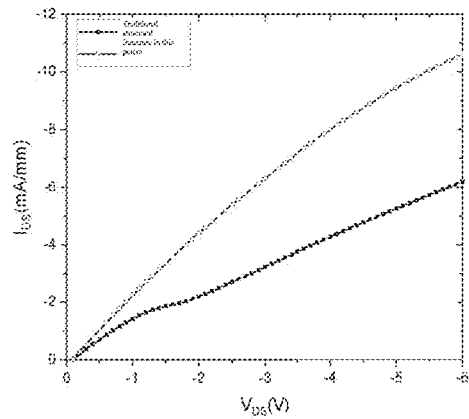
FIG. 4 is a comparison diagram of an output characteristic curve of the P-channel device based on the structure in an embodiment of the invention and an output characteristic curve of the P-channel device based on the traditional structure under the condition of different P-GaN thicknesses of the gate region and the same threshold.
Figure 9:
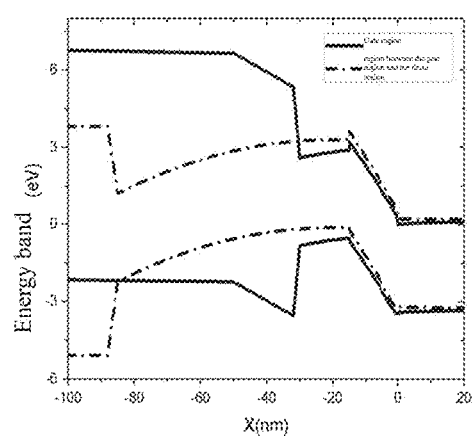
FIG. 9 is a comparison diagram of an energy band of the gate region and an energy band of a region between the gate region and a drain region of the P-channel device based on the traditional structure.
Figure 10:
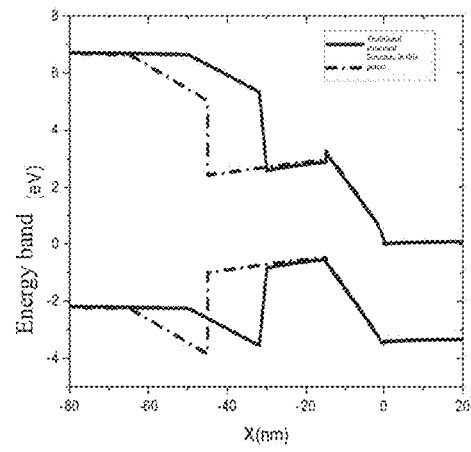
FIG. 10 is a comparison diagram of an energy band of the gate region and an energy band of a region between the gate region and a drain region of the P-channel device based on the structure in an embodiment of the invention.

Next, the middle P-GaN layer (GaN isolation layers) has an extremely low doping concentration to maintain a low hole concentration. The bottom, left side and right side of the gate stack in the gate region of the P-channel device are in contact with the GaN isolation layers, and the low bole concentration allows the valence band at the GaN/AlGaN heterojunction in the gate region to decrease below the Fermi level to turn off the device when the GaN layer below the gate stack has a large thickness. FIG. 9 is a comparison diagram of an energy band of the gate region and an energy band of a region between the gate region and the drain region of the traditional structure, and it can be seen from FIG. 9 that the use of a thicker GaN layer will make the valance band at the GaN/AlGaN heterojunction obviously higher than the Fermi level, which means that the device will operate in a depletion mode, which is not beneficial to safe operation. According to the comparison diagram of energy bands in FIG. 10, GaN in the gate region of the structure of the invention has a larger thickness under the same valence band level of the heterojunction. As shown in FIG. 3 which is a data comparison diagram of the P-channel device based on the structure of the invention and the P-channel device based on the traditional structure under different GaN thicknesses of the gate region and the same threshold, and results further prove the conclusion in FIG. 10, that is, under the same threshold, the invention can increase the GaN thickness in the gate region. FIG. 4 is a comparison diagram of an output characteristic curve of the P-channel device based on the structure of the invention and an output characteristic curve of the P-channel device based on the traditional structure under different GaN thicknesses of the gate region and the same threshold, and it can be seen from FIG. 4 that the output current of the P-channel device based on the structure of the invention is obviously greater than that of the P-channel device based on the traditional structure under the same simulation environment. For a specific embodiment of the invention, the gate region of the P-channel device based on the traditional structure is formed by etching top P-GaN in the gate region, and in the etching process, the mobility of two-dimensional hole gas below will be decreased with the increase of the etching depth. In the invention, GaN below the gate has a larger thickness, that is, the etching depth is small, such that the influence of etching on the mobility of two-dimensional hole gas cab be avoided, thus increasing the output current of the device.

The top P$^+$-GaN layer has a high doping concentration of a P-channel dopant such as Mg or Be, and the high doping concentration is beneficial to the formation of ohmic contact of source and drain regions of the P-channel device to decrease the contact resistance; in addition, after the device is turned on, the P$^+$-GaN layer with a high doping concentration can provide a higher hole concentration to increase the output current of the P-channel device.

Figure 5:
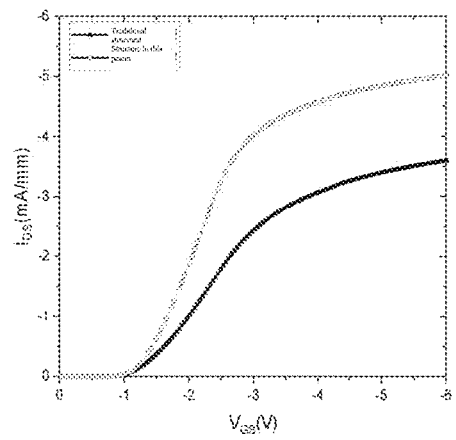
FIG. 5 is a data comparison diagram of the P-channel device based on the structure without an Al—N insertion layer in an embodiment of the invention and the P-channel device based on the traditional structure under the condition of different P-GaN thicknesses of the gate region and the same threshold.

In addition, for the dielectric layer in the gate region, the Al—N insertion layer is combined with a traditional gate dielectric layer to form the gate stack in the invention. First, high-concentration two-dimensional electron gas generated by the polarization effect of the Al—N insertion layer and GaN below can deplete holes in P-GaN in the gate region, thus increasing the threshold voltage of the P-channel device. FIG. 5 is a data comparison diagram of the P-channel device based on the structure without the Al—N insertion layer in an embodiment of the invention and the P-channel device based on the traditional structure under different P-GaN thicknesses of the gate region and the same threshold, wherein in this embodiment, the GaN thicknesses are the same as those in FIG. 3, and it can be known by comparison that the Al—N insertion layer obviously increases the threshold voltage of the device. Moreover, the gate dielectric layer of the traditional P-channel device with a certain thickness is made from a high-forbidden bandwidth dielectric such as aluminum oxide, silicon oxide or silicon nitrogen, which on one hand, can further reduce the valence band level at the heterojunction and increase the threshold voltage of the device, and on the other hand, can withstand a higher voltage and increase the voltage resistance of the gate.

Figure 6:
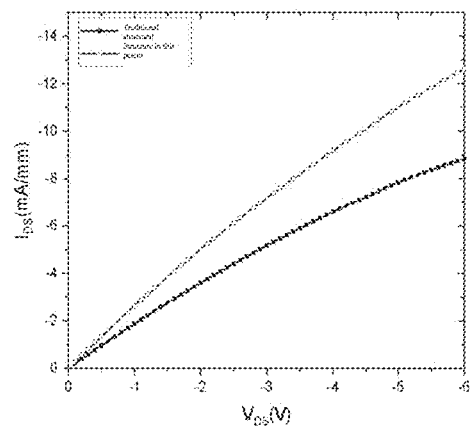
FIG. 6 is a comparison diagram of an output characteristic curve of the P-channel device based on the structure without the Al—N insertion layer in an embodiment of the invention and an output characteristic curve of the P-channel device based on the traditional structure under the condition of different P-GaN thicknesses of the gate region and the same threshold.

FIG. 6 is a comparison diagram of an output characteristic curve of the P-channel device based on the structure without the Al—N insertion layer in an embodiment of the invention and the output characteristic curve of the P-channel device based on the traditional structure under different P-GaN thicknesses of the gate region and the same threshold, and the three P-GaN layers with different doping concentrations arranged in the P-channel device in the invention can guarantee a larger GaN thickness of the gate region, thus decreasing the on-resistance of the device.

The enhancement mode of N-channel and P-channel devices is not only the technical safety requirement of power electronics, but also the design basis of the invention. In the invention, holes in the P-GaN layer 602 and the P$^+$-GaN layer 1502 can cut off electron gas below the AlGaN barrier layer 5 of the N-channel device to guarantee the enhancement mode of the N-channel device; the GaN isolation layer 1401 and the gate dielectric layer 9 can reduce holes generated by polarization of the P-GaN layer 601 of the P-channel device, and electron gas generated by the Al—N insertion layer 16 and the GaN isolation layer 1401 can electrically neutralize the holes in the P-GaN layer 601, thus realizing the enhancement mode of the P-channel device. For the P-channel device, both the P-GaN layer 601 and the P$^+$-GaN layer 1501 can provide holes when the P-channel device is turned on, especially, the P$^+$-GaN layer 1501 can provide high-concentration holes, and the GaN isolation layer 1401 ensures that the turn-on channel has a large area; and the higher hole concentration and the larger channel area can realize a lower on-resistance. The high hole concentration ensures that the ohmic contact resistance between the first source 7 and the P$^+$-GaN layer 1501 and the ohmic contact resistance between the first drain 8 and the P$^+$-GaN layer 1501 are lower, and under the dual action of the low on-resistance and low contact resistance, the output current of the P-channel device in the invention is larger. As shown in FIG. 4 and FIG. 6, the output current of the structure of the invention is increased by 43% and 71% respectively, and the P-channel device with a large output current can greatly decrease the area of the CMOS logic GaN circuit.

To sum up, the invention not only guarantees the enhancement mode of the N-channel and P-channel GaN device, but also increases the output current of the P-channel device; meanwhile, the invention is compatible with the traditional P-GaN HEMT process, has high practicability, and is of great significance for realizing a high-performance GaN CMOS logic circuit.

What is claimed is:

1. An enhancement-mode N-channel and P-channel GaN device integration structure, comprising;
    a substrate, an Al—N nucleating layer being arranged on the substrate, an AlGaN buffer layer being arranged on the Al—N nucleating layer, a GaN channel layer being arranged on the AlGaN buffer layer, and an AlGaN barrier layer being arranged on the GaN channel layer, wherein an isolation layer is arranged in the AlGaN barrier layer and extends into the GaN channel layer, and the isolation layer divides the AlGaN barrier layer and the GaN channel layer into two parts; and
    a P-channel device is arranged on one side of the isolation layer and comprises a first P-GaN layer arranged on the AlGaN barrier layer on one side of the isolation layer, a first GaN isolation layer is arranged on the first P-GaN layer, a first P+-GaN layer is arranged on the first GaN isolation layer, a first source, first gate and a first drain are arranged on the first P+-GaN layer, the first gate is inlaid in the first P+-GaN layer, and a gate dielectric layer is arranged between the first gate and the first P+-GaN layer; and an N-type channel device is arranged on the other side of the isolation layer and comprises a second source, a second P-GaN layer and a second drain which are arranged on the AlGaN barrier layer on the other side of the isolation layer, the second source and the second drain are located on two sides of the second P-GaN layer respectively, a second GaN isolation layer is arranged above the second P-GaN layer, a second P+-GaN layer is arranged above the second GaN isolation layer, and a second gate is arranged above the second P+-GaN layer.

2. The enhancement-mode N-channel and P-channel GaN device integration structure according to claim 1, wherein the first gate and the gate dielectric layer extend towards the first GaN isolation layer and enters the first GaN isolation layer, an Al—N insertion layer is arranged on a lower surface of the gate dielectric layer and located below the first gate, and the gate dielectric layer further extends and wraps around a side face of the Al—N insertion layer.

3. The enhancement-mode N-channel and P-channel GaN device integration structure according to claim 2, wherein the sum of a thickness of the first GaN isolation layer and a thickness of the first P-GaN layer is 20-50 nm.

4. The enhancement-mode N-channel and P-channel GaN device integration structure according to claim 2, wherein the Al—N insertion layer has a thickness of 5-15 nm.

5. The enhancement-mode N-channel and P-channel GaN device integration structure according to claim 2, wherein the first P-GaN layer and the second P-GaN layer have a thickness of 10-15 nm and a doping concentration of $1.0\times10^{18}/cm^3$-$1.0\times10^{19}/cm^3$;

the first GaN isolation layer and the second GaN isolation layer have a thickness of 30-40 nm and a doping concentration of $1.0\times10^{14}/cm^3$-$1.0\times10^{16}/cm^3$; and the first P$^+$-GaN layer and the second P$^+$-GaN layer have a thickness of 20-35 nm and a doping concentration of $1.0\times10^{19}/cm^3$-$1.0\times10^{20}/cm^3$, and a dopant is Mg or Be.

6. The enhancement-mode N-channel and P-channel GaN device integration structure according to claim 1, wherein the first P-GaN layer and the second P-GaN layer have a thickness of 10-15 nm and a doping concentration of $1.0\times10^{18}/cm^3$-$1.0\times10^{19}/cm^3$;

the first GaN isolation layer and the second GaN isolation layer have a thickness of 30-40 nm and a doping concentration of $1.0\times10^{14}/cm^3$-$1.0\times10^{16}/cm^3$; and the first P$^+$-GaN layer and the second P$^+$-GaN layer have a thickness of 20-35 nm and a doping concentration of $1.0\times10^{19}/cm^3$-$1.0\times10^{20}/cm^3$, and a dopant is Mg or Be.

7. The enhancement-mode N-channel and P-channel GaN device integration structure according to claim 1, wherein the gate dielectric layer has a thickness of 5-10 nm and is made from aluminum oxide, silicon oxide, or silicon nitride.

* * * * *